(12) United States Patent
Rosso et al.

(10) Patent No.: US 7,564,885 B2
(45) Date of Patent: Jul. 21, 2009

(54) INTEGRATED MODULATOR-LASER STRUCTURE AND A METHOD OF PRODUCING SAME

(75) Inventors: Marzia Rosso, Rivalta (IT); Simone Codato, Ciriè (IT); Rui Yu Fang, Turin (IT); Guido Alberto Roggero, Ciriè (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/528,002

(22) Filed: Sep. 27, 2006

(65) Prior Publication Data

US 2007/0081566 A1    Apr. 12, 2007

(51) Int. Cl.
*H01S 5/00*    (2006.01)
(52) U.S. Cl. .................. 372/50.1; 372/43.01; 372/87
(58) Field of Classification Search ............... 372/50.1, 372/43.01, 87
See application file for complete search history.

(56) References Cited

U.S. PATENT DOCUMENTS

| | | | |
|---|---|---|---|
| 4,575,919 A | | 3/1986 | Logan et al. |
| 4,872,180 A | | 10/1989 | Rideout et al. |
| 5,717,710 A | * | 2/1998 | Miyazaki et al. ......... 372/50.11 |
| 6,134,368 A | * | 10/2000 | Sakata ....................... 385/131 |
| 6,197,608 B1 | * | 3/2001 | Ha ............................... 438/22 |
| 6,391,671 B2 | * | 5/2002 | Inomoto et al. ............... 438/41 |
| 6,542,533 B1 | | 4/2003 | Parayanthal |
| 6,973,226 B2 | * | 12/2005 | Sato et al. ..................... 385/14 |
| 2001/0019568 A1 | * | 9/2001 | Sakata .......................... 372/50 |
| 2003/0067010 A1 | * | 4/2003 | Iga et al. ...................... 257/103 |
| 2004/0048406 A1 | | 3/2004 | Ikeda et al. ................... 438/29 |

FOREIGN PATENT DOCUMENTS

EP    0760544    3/1997

* cited by examiner

*Primary Examiner*—Minsun Harvey
*Assistant Examiner*—Yuanda Zhang

(57) ABSTRACT

In an arrangement comprised of an electro-absorption modulator integrated with a laser source, the electro-absorption modulator includes a respective metal contact pad, wherein the metal pad is positioned over a localised semi-insulating layer island, such as a Fe—InP island.

11 Claims, 5 Drawing Sheets

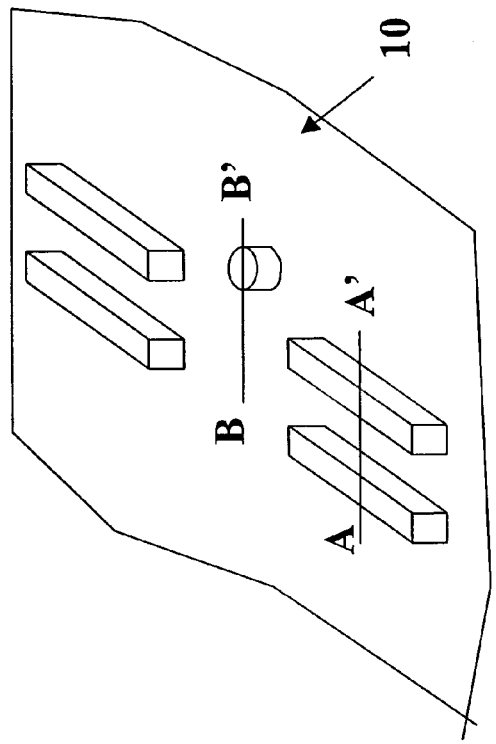
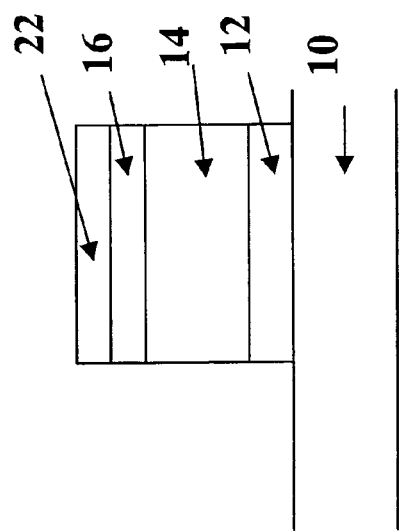
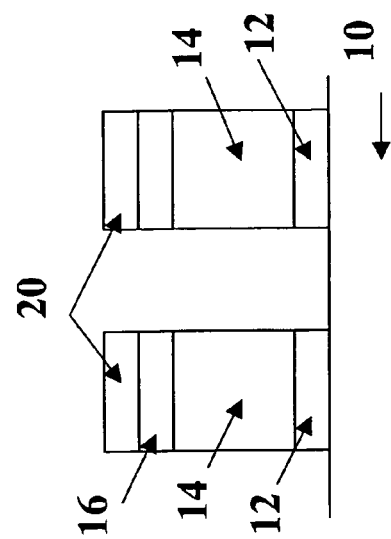

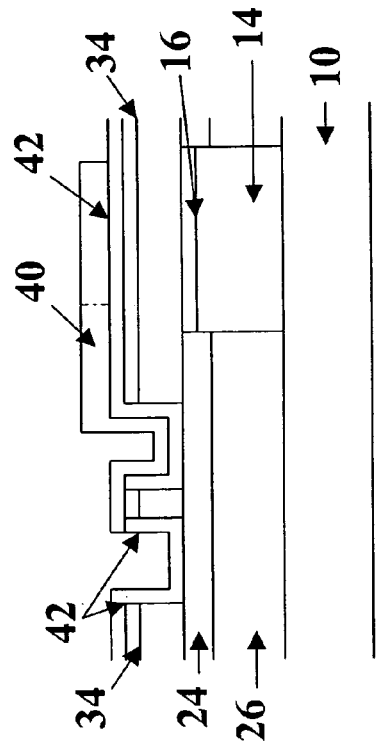
Fig.11
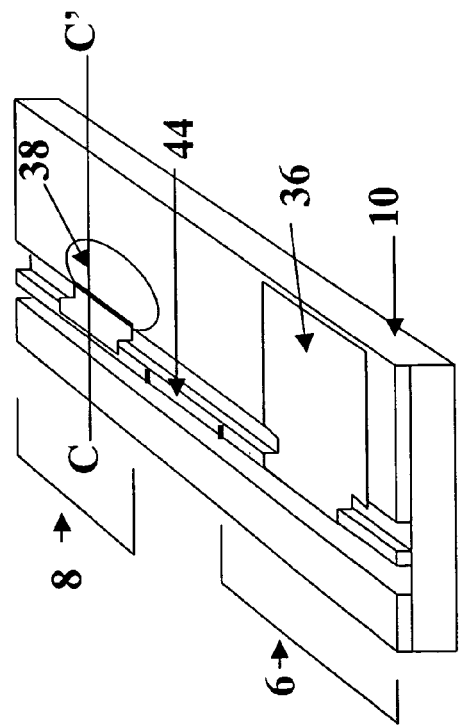
Fig.10
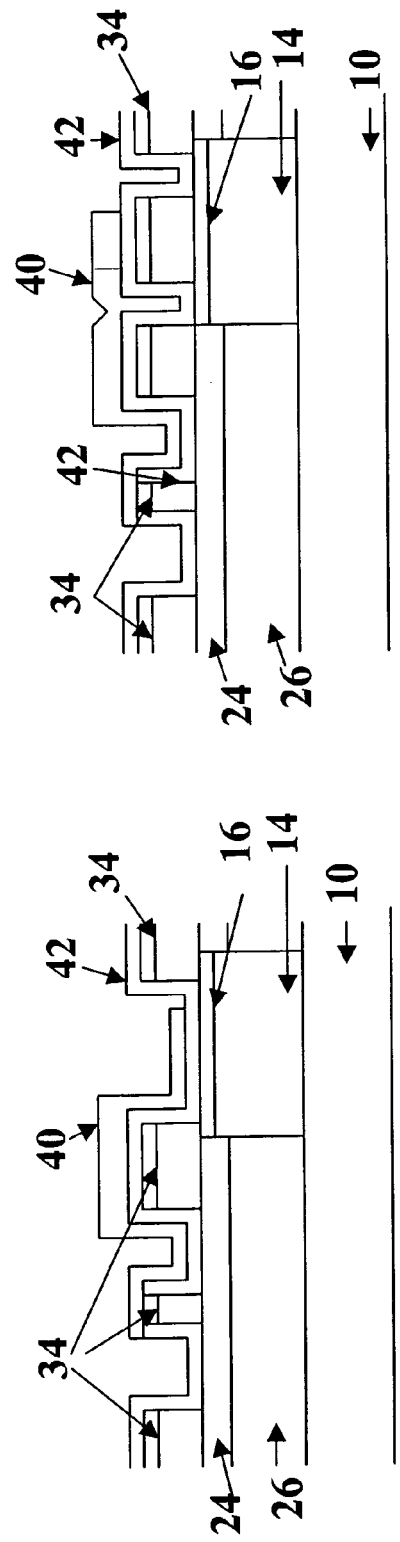
Fig.13
Fig.12

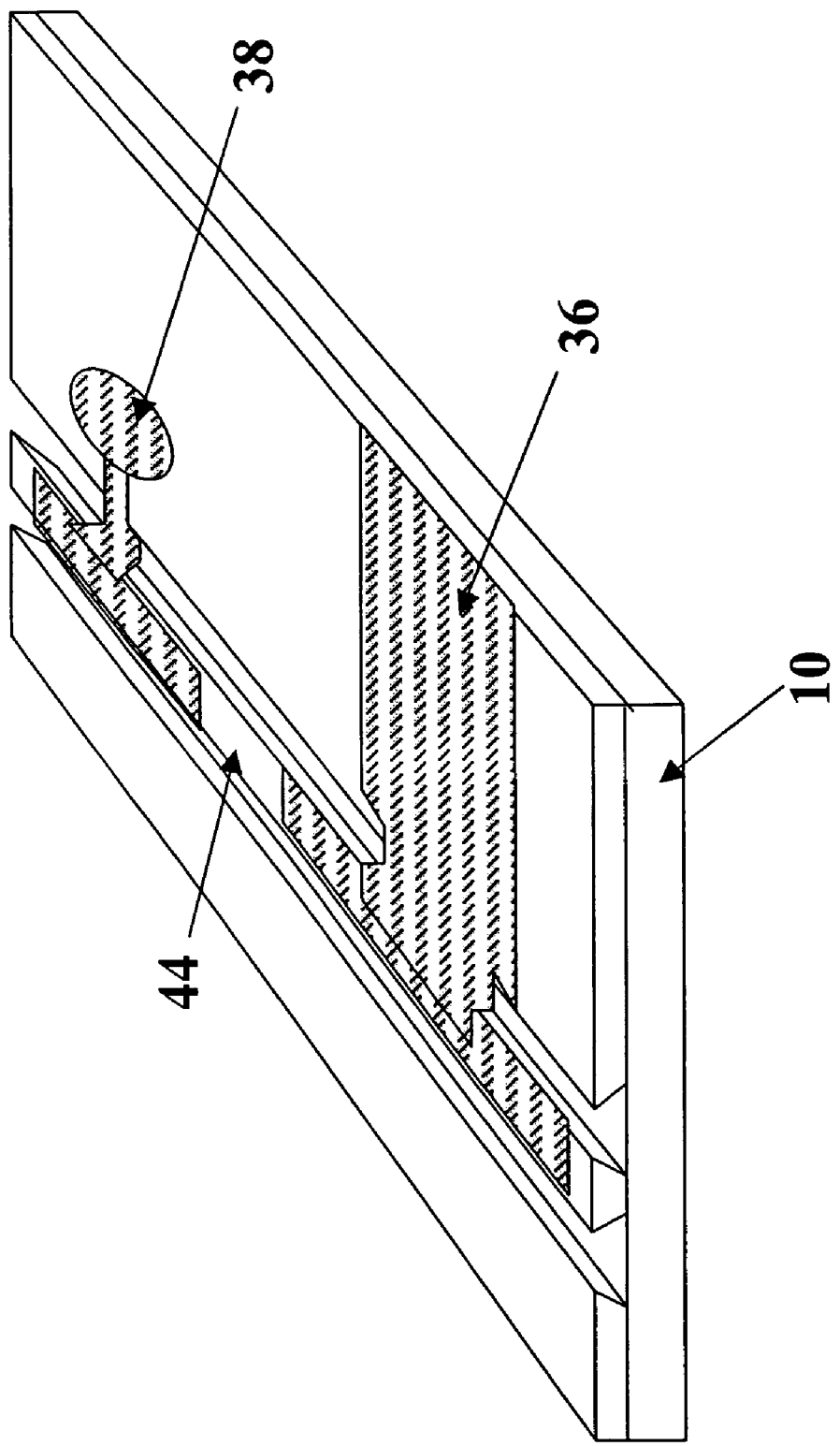

_US 7,564,885 B2_

INTEGRATED MODULATOR-LASER STRUCTURE AND A METHOD OF PRODUCING SAME

FIELD OF THE INVENTION

The invention relates to integrated modulator-laser structures for use e.g. in optical fibre communications.

Specifically, the invention was developed with specific attention paid to its possible application to produce a ridge structure Electro-Absorption modulator (EAM) integrated with a Distributed FeedBack (DFB) laser.

DESCRIPTION OF THE RELATED ART

So-called EAM-DFB arrangements including an Electro-Absorption Modulator integrated with a Distributed FeedBack laser represents an ideal choice for 10-30 km Ethernet and low-chirp 40-80 km OC192 applications with operating ranges in the 1300 nm-1500 nm area and with typical operational rates around 10 Gb/s.

Under these operating conditions, parasitic capacitance is a key parameter. In fact, parasitic capacitance limits performance of ridge device structures that are considered the most appropriate structures for volume production. Currently adopted prior arrangements involve only a thick dielectric film ($S_iO_2$ or $SiN_x$) under the metal pad in the structure. The dielectric film must be very thick to reduce the EAM parasitic capacitance.

However, this solution suffers from intrinsic limitations due to the very thick dielectric film leading to increased processing difficulties during device manufacturing and to device degradation.

Polyamide is also used to replace the dielectric film. Using a polyamide film can minimise the parasitic capacitance. The basic disadvantage of this solution is related to fabrication complexity and chip cost. Additionally, adhesion of the metal part on the polyamide film is critical and may cause device reliability problems.

OBJECT AND SUMMARY OF THE INVENTION

The need therefore exists for arrangements that may radically dispense with the intrinsic drawbacks of the prior art arrangements described in the foregoing.

The object of the present invention is thus to provide such an arrangement.

According to the present invention, that object is achieved by means of an arrangement having the features set forth in the claims that follow. The invention also relates to corresponding manufacturing process. The claims are an integral part of the technical disclosure of the invention provided herein.

In brief, the arrangement described herein offers a simple solution to the problem of reducing parasitic capacitance by positioning the metal pad on a localised semi-insulating layer island. The parasitic capacitance is greatly reduced by the presence of a semi-insulating layer under the dielectric film whose thickness no longer represents a critical parameter.

The related processing is not appreciably modified with respect to standard integrated ridge structure processing. The semi-insulating layer is grown on a planar surface during a standard process; then this layer is etched off and only isolated islands remain. Eventually, the EAM metal pads are aligned and centred on these localised islands. The whole fabrication process uses only standard processes and is thus promising both in terms of low cost and expected device performance.

Preferred embodiments of the invention provide for a Fe—InP (or other semi-insulating material) layer being used not for lateral confinement, but only for reducing the EAM parasitic capacitance. This means that the localised Fe—InP islands are created and used only in the positions of the EAM pad. Such an arrangement has the advantage of replacing polyamide film (thus dispensing with the intrinsic shortcomings related thereto). The related processing method entails only a minor modification of the conventional EAM-DFB vertical-ridge (or reverse-ridge) integration fabrication processes.

BRIEF DESCRIPTION OF THE ANNEXED DRAWINGS

The invention will now be described, by way of example only, by referring to the enclosed figures of drawing, wherein:

FIGS. 1 to 9 represent subsequent steps of manufacturing a circuit arrangement as described herein, wherein FIGS. 4 and 5 correspond to sectional views along lines A-A' and B-B' of FIG. 3, respectively, FIG. 10 is a chip surface view of the device produced as a result of the steps illustrated in FIGS. 1 to 9, in which the whole DFB and EAM sections are indicated, FIG. 11 is a cross-sectional view along line C-C' of FIG. 10, and FIGS. 12 to 14 show alternative embodiments of the circuit arrangement described herein.

DETAILED DESCRIPTION OF PREFERRED EMBODIMENTS OF THE INVENTION

While this detailed description of certain preferred embodiments of the arrangement described herein will primarily refer to a vertical-side-wall structure (and in some instances also to reverse-ridge structure) those of skill in the art will promptly appreciate that the solution described herein can be applied to any type of integration structure requiring a low-parasitic capacitance. This irrespective of the kind of active materials (bulk, MQW, InGaAsP system or Al- or N-containing systems), waveguides (direct, curved), waveguide profiles (vertical-sidewall or reverse-ridge) actually used. In that respect, the scope of the invention encompasses lateral buried structures (e.g. semi-insulating or reverse-junction blocking structures).

As a first step of the process described herein, FIG. 1 shows a step involving a planar growth of a semi-insulating layer over a substrate 10 typically comprised of a n-InP substrate.

Over the substrate 10 a so-called etch-stop InGaAsP layer 12 is provided acting as a basis for growing a semi-insulating layer 14 typically comprised of a Fe—InP layer over which a n-InP layer 16 is grown. It will be appreciated that FIG. 1 is essentially a vertical cross-sectional view of the layered structure described.

FIG. 2 schematically illustrates (essentially in a plan top view) a mask pattern adapted to define different semi-insulating island patterns in the structure illustrated in FIG. 1. Specifically, in FIG. 2 reference numerals 20 designate bar-like or strip-like $SiO_2$ mask patterns intended to be used in etching a groove structure and growing corresponding distributed feedback (DFB) laser materials.

Reference numeral 22 conversely designates an island-like $SiO_2$ mask pattern intended to be used in defining an electro-absorption modulator (EAM) metal pad contact area.

FIG. 3 is schematically representative of the result of an etch process effected on the structure of FIG. 1 by using the mask pattern illustrated in FIG. 2.

FIG. 4 is a cross-sectional view along line A-A' showing the etch profile where the DFB laser MQW layers are to be grown. Similarly, FIG. 5 is a cross-sectional etch profile along the line B-B' where the modulator layers are to be grown and the metal pad is to be positioned.

Figure 1:
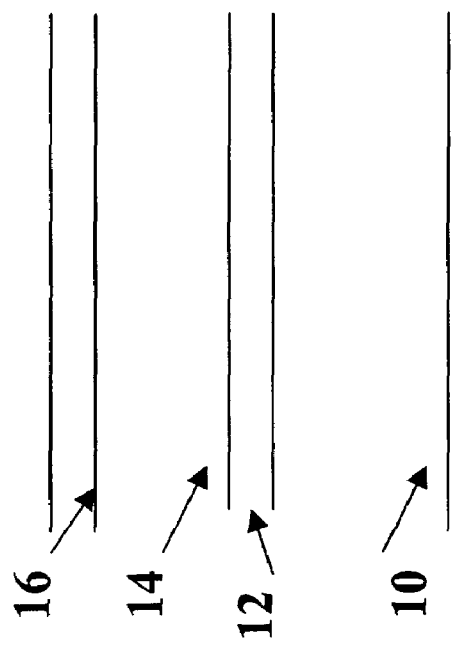

In both FIGS. 4 and 5 the same reference numerals already appearing in FIG. 1 are used to designate the various layers illustrated. Additionally, in FIGS. 4 and 5, the reference numerals 20 and 22 are used to indicate the $SiO_2$ patterns corresponding to the masks shown in FIG. 2.

Figure 6:
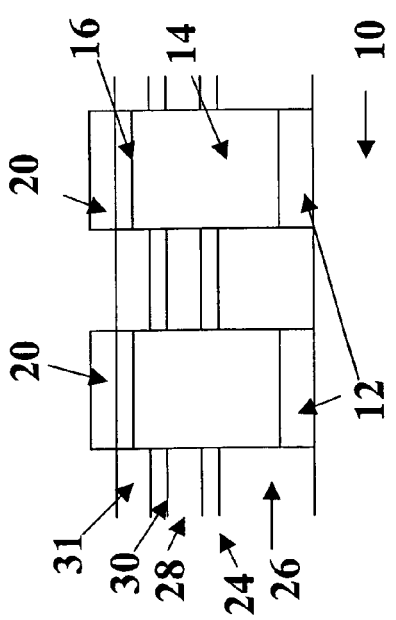

FIG. 6 can again be seen as corresponding to the cross-sectional view of FIG. 4. FIG. 6 shows the effects of the SAG growth (around and between the bar-like or strip-like structures resulting from the etch process due to the presence of the masks 20) of a n-InP buffer layer 26, a Multi Quantum Well (MQW) structure 24, a p-InP spacer 28, an InGaAsP grating layer 30 and a p-InP cap layer 31.

Figure 7:
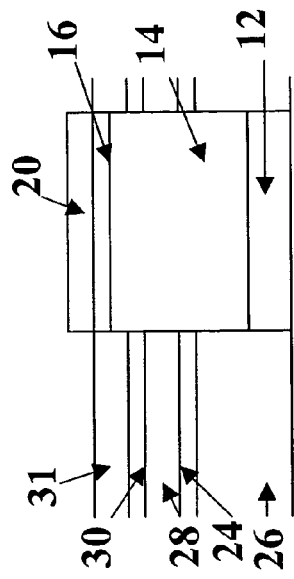

The results of such a SAG growth process obviously extend to the island region shown in FIG. 5 as schematically shown in FIG. 7, where reference numeral 24 designates in this case the electro-absorption modulator (EAM) multi quantum well (MQW) layer whose compositions are different from those of the laser layers due to the presence of mask patterns 20 during SAG growth.

After SAG growth the DFB gratings are defined by Electron Beam Lithography (EBL) and then etched by Reactive Ion Etching (RIE).

Figure 9:
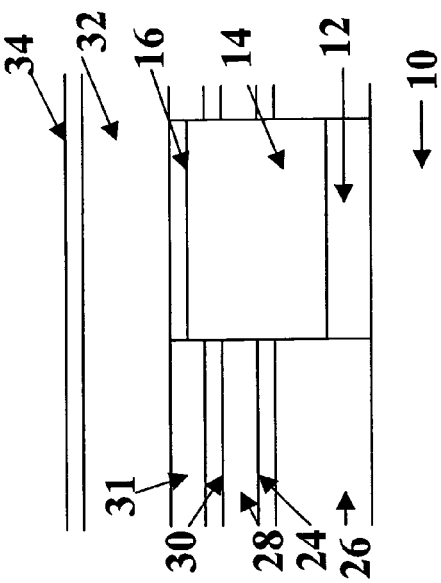
Figure 8:
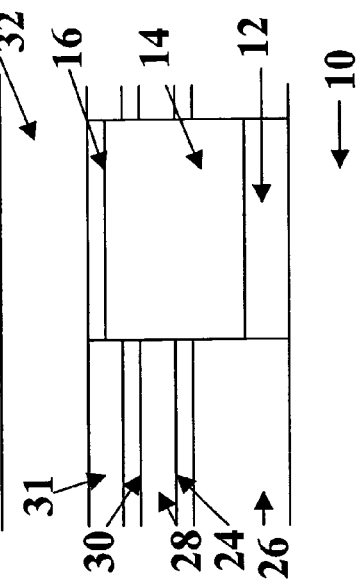

Finally, FIGS. 8 and 9 (which again notionally correspond to FIGS. 4 and 5, respectively) represent the effect obtained by growing over the gratings a further p-InP cladding layer 32 followed by a p-InGaAs contact layer 34.

These cladding and contact layers are grown, like all the previous growth steps discussed in the foregoing, by resorting to standard techniques that are well-known in the art, thus making it unnecessary to provide a more detailed description herein.

FIG. 10 is a perspective chip surface view illustrative of the results of various steps discussed in the foregoing plus the creation of metal pads to be better detailed in the following.

Figure 2:
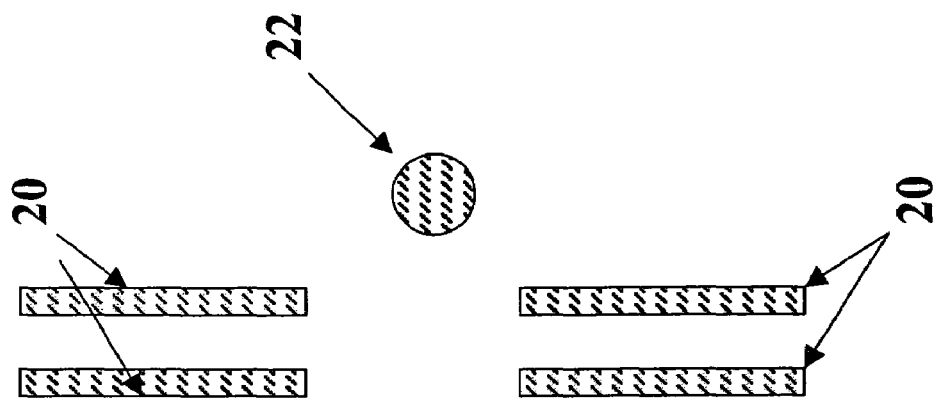

Essentially, the perspective view of FIG. 10 is intended to illustrate the presence, within the chip produced, of:
- a laser (DFB) section 6 including the ridge structure and the metal pad arrangements 36,
- a modulator (EAM) section 8 including the ridge structure and the metal pad arrangements 38, and
- a laser (DFB) pad 36 corresponding essentially to the position outside one of the pairs of strip-like mask patterns shown in FIG. 2, and
- a modulator (EAM) pad 38 essentially corresponding to the position of the island pattern 22 of FIG. 2.

FIG. 11 is a partial cross-sectional view along line C-C' wherein the layer structure of the EAM pad 38 is shown in greater detail. The same reference numerals already appearing in the previous figures have been used to designate the layers shown in FIG. 11. It will be appreciated that only the most significant layers are shown in FIG. 11 for the sake of simplicity.

Specifically, reference 40 designates an EAM metal pad deposited over the p-InGaAs contact layer 34 with the interposition of $SiO_2$ insulation layer 42.

A thoroughly similar contact arrangement is used in correspondence with the DFB pad 36. However, an insulation region 44 is provided between the two as better highlighted in FIG. 10.

FIGS. 12 and 13 are illustrative of variants of the arrangement shown in FIG. 11 in the case of "recessed EAM" and "isolated EAM" pad structures, respectively.

FIG. 14 is substantially similar to FIG. 10 and is intended to highlight the so-called reverse-ridge structure, over the chip including a DFB pad 36, an EAM pad 38 as well as an insulation region 44.

The reverse-ridge integration structure of FIG. 14 can be easily produced, by resorting to known process steps, by using the same method described in the foregoing. In any case, at the end of the manufacturing process, the EAM metal pads are aligned and centred on the localised islands comprised of the localised semi-insulating layer (Fe—InP) islands 14.

Consequently, without prejudice to the underlying principles of the invention, the details and embodiments may vary, even significantly, with respect to what has been described previously, just by way of example, without departing from the scope of the invention as defined by the annexed claims.

What is claimed is:

1. An integrated electro-optical device comprising:
    a distributed feedback laser (DFL) structure;
    an electro-absorption modulator (EAM) structure integrated with the DEL structure, the EAM structure comprising:
    a substrate layer;
    one or more buffer layers disposed on an upper surface of the substrate layer;
    one or more multi quantum well (MOW) layers disposed on said one or more buffer layers;
    one or more other layers disposed on said one or more MOW layers, said one or more other layers including at least a cladding layer and a contact layer;
    a localized EAM island region having an upper portion, side portions, and a lower portion, the upper portion comprising an upper surface having a width dimension, the side portions of the island region extending between the upper and lower portions of the island region, the side and lower portions of the localized island region being laterally surrounded by said one or more MOW layers and by said one or more other layers, the island region including at least a semi-insulating material; and
    an EAM contact pad disposed on said one or more other layers, the contact pad having a width dimension, wherein said contact pad is positioned over the localized EAM island region such that said EAM contact pad is generally centered and aligned with the upper surface of the upper portion of the localized EAM island region in the width dimensions of the localized EAM island region and of the EAM contact pad; and
    an isolation region interposed between the DEL structure and the EAM structure.

2. The device of claim 1, wherein said DEL structure comprises:
    said substrate layer;
    said one or more buffer layers;
    said one or more MQW layers;
    said one or more other layers;
    a localized DEL island region laterally surrounded by said one or more MQW layers and by said one or more other layers, the DEL island region including at least a semi-insulating layer; and
    a DEL contact pad disposed on said localized DEL island region such that said DEL contact pad is generally centered and aligned with the localized DEL island region.

3. The device of claim 1, wherein said semi-insulating layer of said EAM island region is a Fe—InP layer.

4. The device of claim 1, further comprising at least one dielectric film interposed between said EAM contact pad and said contact layer.

5. The device of claim 1, wherein said device is in the form of a vertical-side-wall ridge structure.

6. The device of claim 1, wherein said device is in the form of a reverse-ridge structure.

7. A method of producing an integrated electro-optical device, the method comprising:
   forming a distributed feedback laser (DFL) structure;
   forming an electro-absorption modulator (EAM) structure, wherein the EAM structure comprises:
      a substrate layer;
      one or more buffer layers disposed on an upper surface of the substrate layer;
      one or more multi quantum well (MQW) layers disposed on said one or more buffer layers;
      one or more other layers disposed on said one or more MQW layers, said one or more other layers including at least a cladding layer and a contact layer;
      a localized EAM island region having an upper portion, side portions, and a lower portion, the upper portion comprising an upper surface having a width dimension, the side portions of the island region extending between the upper and lower portions of the island region, the side and lower portions of the localized island region being laterally surrounded by said one or more MQW layers and by said one or more other layers, the island region including at least a semi-insulating material; and
      an EAM contact pad disposed on said one or more other layers, the contact pad having a width dimension, wherein said contact pad is positioned over the localized EAM island region such that said EAM contact pad is generally centered and aligned with the upper surface of the upper portion of the localized EAM island region in the width dimensions of the localized EAM island region and of the EAM contact pad; and
   forming an isolation region interposed between the DFL structure and the EAM structure.

8. The method of claim 7, wherein said semi-insulating layer is a Fe—InP layer.

9. The method of claim 7, wherein said one or more layers include at least one dielectric film disposed between said EAM contact pad and said contact layer.

10. The method of claim 7, further comprising:
   forming a vertical-side-wall ridge structure in the electro-optical device.

11. The method of claim 7, further comprising:
   forming a reverse-ridge structure in the electro-optical device.

* * * * *

UNITED STATES PATENT AND TRADEMARK OFFICE
CERTIFICATE OF CORRECTION

PATENT NO. : 7,564,885 B2  
APPLICATION NO. : 11/528002  
DATED : July 21, 2009  
INVENTOR(S) : Marzia Rosso Page 1 of 1

It is certified that error appears in the above-identified patent and that said Letters Patent is hereby corrected as shown below:

Column 4, Line 25, Claim 1, delete "DEL" and insert --DFL--.

Column 4, Line 30, Claim 1, delete "(MOW)" and insert --(MQW)--.

Column 4, Line 33, Claim 1, delete "MOW" and insert --MQW--.

Column 4, Line 42, Claim 1, delete "MOW" and insert --MQW--.

Column 4, Line 53, Claim 1, delete "DEL" and insert --DFL--.

Column 4, Line 55, Claim 2, delete "DEL" and insert --DFL--.

Column 4, Line 61, Claim 2, delete "DEL" and insert --DFL--.

Column 4, Line 63, Claim 2, delete "DEL" and insert --DFL--.

Column 4, Line 65, Claim 2, delete "DEL" and insert --DFL--.

Column 4, Line 65, Claim 2, delete "DEL" and insert --DFL--.

Column 4, Line 66, Claim 2, delete "DEL" and insert --DFL--.

Column 4, Line 67, Claim 2, delete "DEL" and insert --DFL--.

Signed and Sealed this  
Fifth Day of March, 2013

Teresa Stanek Rea  
*Acting Director of the United States Patent and Trademark Office*